United States Patent [19]

Thornburg et al.

[11] 4,288,836
[45] Sep. 8, 1981

[54] CAPACITANCE CONTROLLED KEYSWITCH

[75] Inventors: David D. Thornburg, Los Altos, Calif.; Brian Rosen, Pittsburgh, Pa.

[73] Assignee: Xerox Corporation, Stamford, Conn.

[21] Appl. No.: 43,519

[22] Filed: May 29, 1979

[51] Int. Cl.³ .............................................. H01G 5/16
[52] U.S. Cl. .............................. 361/288; 200/DIG. 1; 400/479.1
[58] Field of Search ................ 361/288, 291, 278; 400/479.1; 200/DIG. 1; 340/365 C

[56] References Cited

U.S. PATENT DOCUMENTS

| 3,693,059 | 9/1972 | Harris | 361/288 |
| 3,710,209 | 1/1973 | Webb et al. | 361/288 |
| 3,900,712 | 8/1975 | Fukao | 400/479.1 |
| 3,965,399 | 6/1976 | Walker | 361/288 |

FOREIGN PATENT DOCUMENTS 411619  6/1934  United Kingdom ............... 361/291

OTHER PUBLICATIONS

IBM Tech. Disc. Bulletin, vol. 17, #11, Apr. 1975, p. 3377.

Primary Examiner—E. A. Goldberg
Attorney, Agent, or Firm—Serge Abend

[57] ABSTRACT

A tri-state capacitance controlled keyswitch having a deformable concave electrode moveable by means of an actuator toward and away from a pair of capacitor plates underlying a dielectric layer in order to change the capacitive coupling between the capacitor plates. The electrode is normally remote from the dielectric layer in a weak capacitance open circuit position, a first higher capacitance closed circuit position exists when the electrode is undeformed and is in contact with the dielectric layer, and a second highest capacitance closed circuit position exists when the electrode is deformed and is in contact with the dielectric layer.

3 Claims, 9 Drawing Figures

CAPACITANCE CONTROLLED KEYSWITCH

This invention relates to a capacitance controlled keyswitch in which a movable electrode is moved toward and away from a pair of spaced coplanar capacitor plates, sandwiched between a substrate and a dielectric layer, in order to vary the capacitive coupling between the plates.

Keyswitches as commonly used in keyboards of electronic text input devices have only two states, ON and OFF. Of these, the capacitive coupled keyswitch is well known as represented by that disclosed in U.S. Pat. No. 3,965,399 and U.S. Pat. No. 3,659,163. Also, well known are snap-action capacitive keyswitches as represented by that disclosed in U.S. Pat. No. 3,643,041 and U.S. Pat. No. 3,751,612.

There are instances, however, when it is desirable to have a third state which becomes activated if the force applied to the keyswitch is substantially beyond that needed to switch it to its ON state. For example, this third state could control the simultaneous display of an alphabetic symbol with a related accent mark such as the German "umlaut", the French "cedilla" or the Spanish "tilde". In the known prior art text input devices the accented letter may be displayed by depressing a keybutton dedicated soley to that function or by depressing the selected keybutton, backspacing, and then depressing the accent mark, usually in conjunction with the shift key. Alternatively, a third keyswitch state could control the automatic repetition of a selected character.

The present invention comprises a capacitance controlled keyswitch which undergoes a first abrupt transition from a relatively low capacitance state to a higher capacitance state under normal keystroke pressure, and which undergoes an additional abrupt and pronounced capacitance increase under still greater application of pressure. Thus, in normal keystroke operation the keyswitch is moved from the low capacitance OFF position to the higher capacitance $ON_1$ position. In order to address the extraordinary $ON_2$ position a substantially higher keystroke force required. The clear benefit derived over the known multi-keyswitch array is the elimination of plural keystrokes for achieving some beneficial functions. The discrete signal levels of capacitance for each keyswitch may be detected with suitable circuitry and applied through machine logic to perform the desired functions.

One way of carrying out the invention is described in detail below with reference to the drawings, in which.

Figure 1:
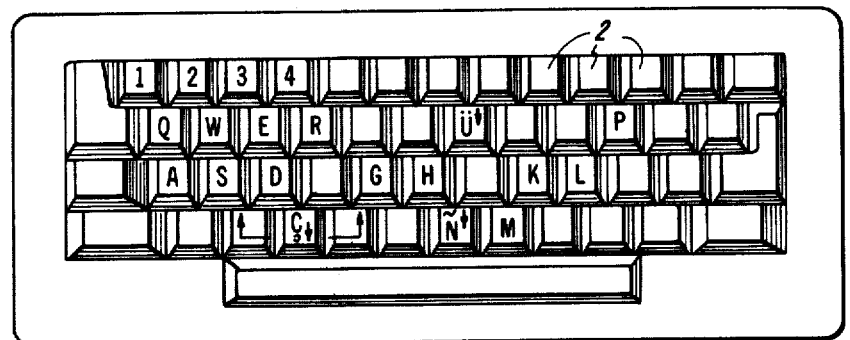
FIG. 1 is a plan view of a keyboard of an eletronic text input device which incorporates keyswitches in accordance with the present invention.

With particular reference to the drawings there is illustrated in FIG. 1 a keyboard 1 of an electronic text input device bearing an array of keybuttons 2 each having marked thereon a legend representive of the output character to be displayed upon actuation of its associated keyswitch. Three keybuttons are shown bearing legends which make them particularly suitable for use with this invention, namely accent marks associated with particular letters.

Figure 2:
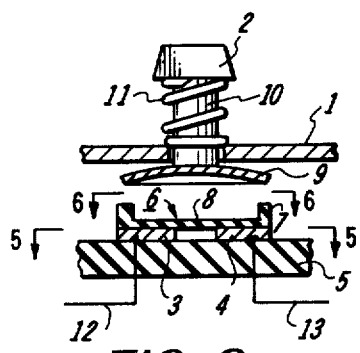
FIG. 2 is a partial sectional view taken substantially along line 2—2 of FIG. 1 showing the novel keyswitch in the OFF position.
Figure 3:
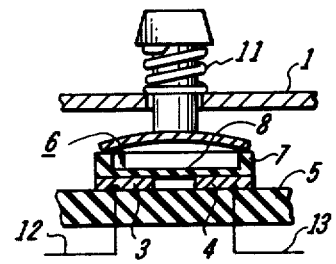
FIG. 3 is a partial sectional view also taken substantially along line 2—2 of FIG. 1 showing the novel keyswitch in the $ON_2$ position.
Figure 4:
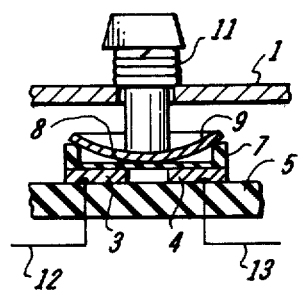
FIG. 4 is a partial sectional view taken substantially along line 2—2 of FIG. 1 showing the novel keyswitch in the $ON_2$ position.
Figure 5:
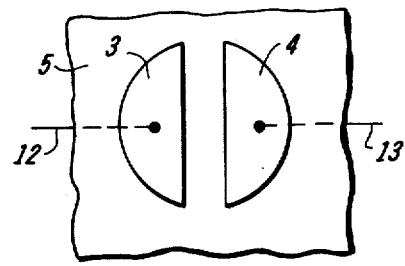
FIG. 5 is a partial sectional view taken substantially along line 5—5 of FIG. 2 showing the capacitor plates.

In FIGS. 2-4 the novel tri-state keyswitch of this invention is illustrated in each of its three states. It comprises a pair of conductive capacitor plates 3 and 4 (as seen in plan view in FIG. 5) disposed upon a rigid insulating substrate 5 and underlying a dielectric layer 6. The dielectric layer 6 is preferably stepped, having a peripheral annulus of thicker dielectric material forming a seat 7 around the outer edge of a thinner interior portion 8 (as seen in plan view in FIG. 6).

The moveable portion of the keyswitch of this invention comprises a deformable concave electrode 9 made of a conductive material connected near its center by keyplunger 10 to keybutton 2. Suitable resilient means urges the entire moveable portion of the keyswitch upwardly so that electrode 9 and capacitor plates 3 and 4 are normally separated. In the accompanying drawings, the resilient member is seen to be a spring 11 disposed between the keybutton 2 and the face of the keyboard 1. Output leads 12 and 13 attached to capacitor plates 3 and 4, respectively, extend through the insulating substrate 5 to provide an output signal representative of the capacitance between the plates.

Figures 6, 7:
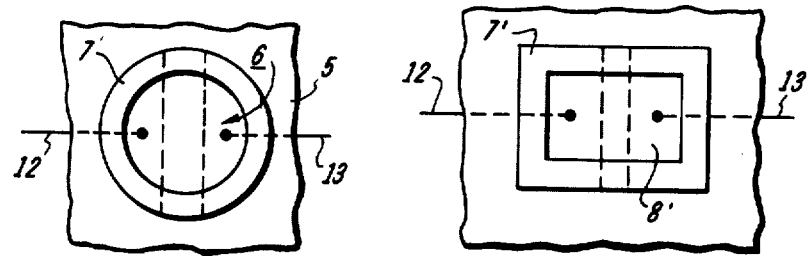
FIG. 6 is a partial sectional view taken substantially along line 6—6 of FIG. 2 showing the stepped annular dielectric.
FIG. 7 is a partial sectional view also taken substantially along line 6—6 of FIG. 2 showing an alternative embodiment of the stepped annular dielectric.

In the alternative embodiment illustrated in FIG. 7 like parts are designated by like numerals with a prime (') added. The rectangular dielectric layer 6' includes a stepped annular portion 7' and a thinner interior portion 8'. The conforming movable concave electrode which will also be rectangular is not shown.

To better enable those skilled in the art to practice this invention the following specific example, reciting the mode of fabrication and materials which may be used, is provided. A known circuit board comprising the insulating substrate 5 is copper clad and then laminated with a dry film resist such as a 0.001 inch thick layer of Riston (a trademark of E. I. Dupont and Nemours) photopolymer. The pattern of the capacitor plates 3 and 4 is then exposed and etched in the copper layer. The photopolymer film is left over the copper capacitor plates to serve as a dielectric. Then, the circuit board is again covered with another layer of Riston photopolymer of approximately 0.005 inch and is again exposed and developed to form the annular stepped portion 7 of the dielectric. The width of the annular ring is kept small to allow the moveable deformable electrode 9 to be readily depressed by "snap" action so that the center of the electrode is brought into contact with the thin central section 8 of the dielectric layer. Electrode 9 is fabricated from a thin sheet of spring material, such as a 0.005 inch thick foil of beryllium copper, which has been formed into a slightly concave geometry whose dish depth is 0.005 inch. Thus, the "throw" of deformable electrode 9 from concave to convex configuration will be approximately 0.01 inch.

As is well known, the capacitance of a parallel plate capacitor is directly proportional to the dielectric constant and is inversely proportional to the separation of the plates. In the configuration of this invention, the capacitive effect is equivalent to two parallel plate capacitors connected in series, each of the plates 3 and 4 coupled with the electrode 9. When the keyswitch is in the OFF position, as shown in FIG. 2, the capacitive coupling is very weak yielding a very low reading across leads 12 and 13.

Figure 8:
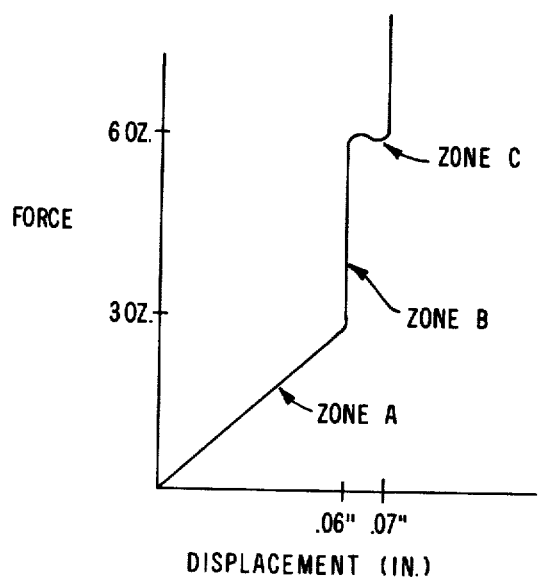
FIG. 8 is a graph showing the force/displacement characteristics of a keyswitch constructed in accordance with the present invention.

In operation, the operator will apply a force to each selected keybutton 2 as on a standard keyboard. A normal force of about three grams will move the keybutton 2 downwardly as graphically illustrated by the legend "Zone A" in FIG. 8. This force will compress spring 11 to move concave electrode 9 to the point at which its peripheral lip becomes seated on the annular stepped seat 7 of the dielectric layer, as seen in FIG. 3. When the keyswitch has arrived at this $ON_1$ position the capacitive coupling becomes abruptly higher than at the rest position. The text input device would be programmed to display the single selected keyboard character at $ON_1$.

Alternatively, in accordance with the novel feature of this invention, the operator may wish to display something other than the single selected character such as, for example, the "o", "n", or "c" shown in FIG. 1 or a repetition of the selected keyboard character. This may be accomplished by a single keystroke of substantially greater than normal force, such as six to ten grams. Upon striking the keybutton 2 with greater force, the concave electrode 9 will initially move downwardly until it comes to rest against the annular stepped seat 7 (through Zone A), then the force strongly urges the electrode and dielectric together with no displacement (through Zone B) until the deformation threshold of the electrode is reached and passed (through Zone C) thus "snapping" the concave electrode into a convex configuration as seen in FIG. 4. When the keyswitch has arrived at this $ON_2$ position the capacitive coupling abruptly achieves its highest value.

Figure 9:
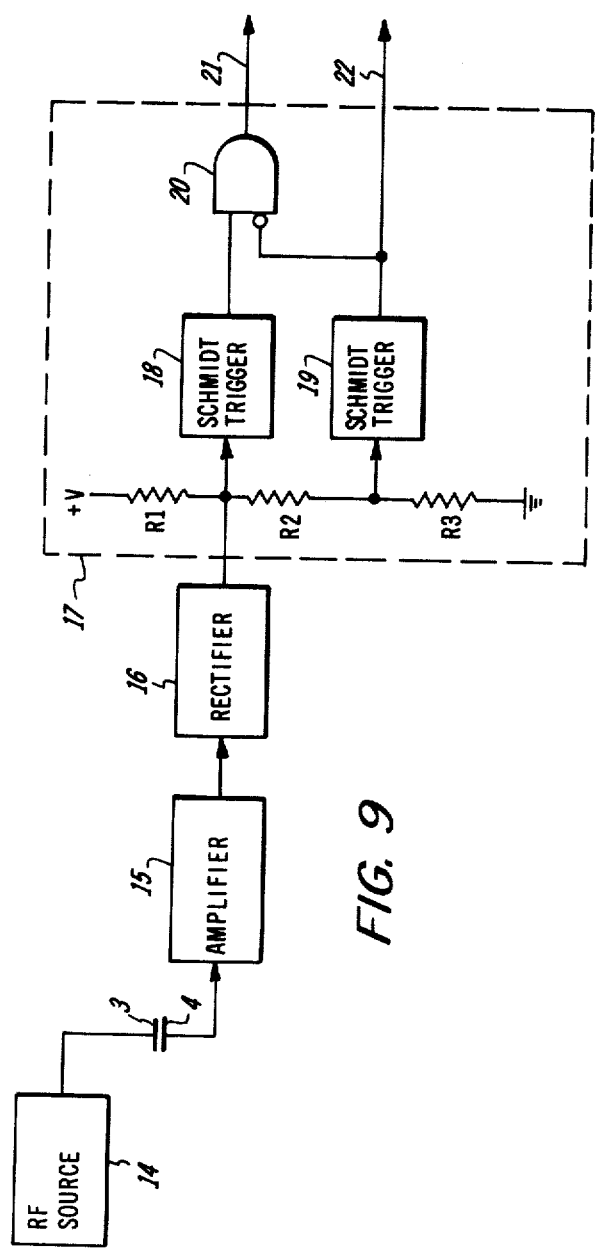
FIG. 9 is a schematic circuit diagram in block form showing means for detecting the signal output from the keyswitch constructed in accordance with the present invention.

A preferred detection circuit for the keyswitch is shown in FIG. 9. The detection circuit includes an a-c signal source 14 desirably in the RF range (e.g. 3 MHz) which is connected to the plate 3 of the tri-state keyswitch. The other plate 4 of the keyswitch is coupled through an amplifier 15 and rectifier 16 to a two-stage analog comparator 17 comprised of a pair of Schmidt triggers 18 and 19. A voltage divider in the form of resistors R1, R2 and R3 and voltage source +V establish the threshold levels for the Schmidt triggers 18 and 19. More specifically, the input to the Schmidt trigger 18 is connected to the voltage source +V through the resistor R1 and to ground through resistors R2 and R3. The output of the rectifier 16 is applied directly to the input of Schmidt trigger 18. On the other hand, the input to the Schmidt trigger 19 is connected to the voltage source +V through the resistors R1 and R2 and to ground through the resistor R3. The output of the rectifier 16 is applied through resistor R2 to the input of Schmidt trigger 19.

The output of Schmidt trigger 18 is applied to one input of an AND-gate 20 and the output of Schmidt trigger 19 is applied as an inverted input to AND-gate 20. The two outputs 21 and 22 of the detector circuit 17 include the output of AND-gate 20 and the output of Schmidt trigger 19.

In operation, the output of the tri-state keyswitch as amplified and rectified through 15 and 16, respectively, is applied to the two-stage analog comparator 17. In the OFF condition illustrated in FIG. 2 the input signal to Schmidt trigger 18 is below its threshold level yielding a low (binary 0)output which is applied to one input of AND-gate 20. The input signal to Schmidt trigger 19 is also below its threshold level yielding a low (binary 0) output which is inverted and applied as a high (binary 1) signal to the other input of AND-gate 20 resulting in a first low output signal from the comparator 17 at 21. The low output signal from Schmidt trigger 19 also directly provides a second low output signal from the comparator 17 at 22. When both outputs 21 and 22 are low, the normal low capacitance OFF condition exists.

In the $ON_1$ condition as seen in FIG. 3 the input signal to Schmidt trigger 18 is higher than its threshold resulting in a high output signal to AND-gate 20 and the input signal to Schmidt trigger 19 is lower than its threshold resulting in a low output signal which is inverted and applied to the AND-gate 20 resulting in a first high output signal from the comparator 17 at 21. The low output signal from Schmidt trigger 19 also directly provides a second low output signal from the comparator 17 at 22. When output 21 is high and output 22 is low, the normal higher capacitance $ON_1$ condition is indicated.

In the $ON_2$ condition as seen in FIG. 3 the input signal to Schmidt trigger 18 is higher than its threshold resulting in a high output signal to AND-date 20 and the input signal to Schmidt trigger 19 is also higher than its threshold resulting in a high output signal which is inverted and applied to the AND-gate 20 resulting in a first low output from the comparator 17 at 21. The high output signal from Schmidt trigger 19 also directly provides a second high output signal from the comparator 17 at 22. When output 21 in low and output 22 is high the highest capacitance $ON_2$ condition is indicated.

It is understood that the present disclosure has been made only by way of example and that numerous changes in details of construction and the combination and arrangement of parts may be resorted to without departing from the true spirit and the scope of the invention as hereinafter claimed.

We claim:

1. In a capacitance controlled keyswitch including a substrate, a pair of spaced coplanar capacitor plates overlying said substrate and a dielectric layer overlying said spaced capacitor plates, the improvement comprising:

a deformable electrode mounted for movement toward and away from said capacitor plates, means to enable three discrete states of switch operation to be selected in accordance with the position of said movable electrode relative to said capacitor plates said means comprising an actuator to move said electrode to a first switch state wherein said electrode remains in its undeformed state and is spaced from said dielectric layer, to a second switch state wherein said electrode remains substantially undeformed and is in contact with said dielectric layer, and to a third switch state wherein said electrode is in a deformed state and is in contact with said dielectric layer, and said dielectric layer is in the form of a stepped member comprising a thin central layer and a thicker peripheral annulus, wherein said deformable electrode contacts said dielectric layer on said peripheral annulus.

2. The capacitance controlled keyswitch defined in claim 1 wherein said electrode is formed with a concavity facing said dielectric layer and wherein the periphery of said electrode makes contact with said peripheral annulus in said second switch state.

3. The capacitance controlled keyswitch defined in claim 2 wherein said electrode is deformed to a convex configuration in said third switch state.

* * * * *